United States Patent
Ishikawa

(10) Patent No.: US 6,346,830 B1
(45) Date of Patent: Feb. 12, 2002

(54) DATA INPUT/OUTPUT CIRCUIT AND INTERFACE SYSTEM USING THE SAME

(75) Inventor: Toru Ishikawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/478,194

(22) Filed: Jan. 5, 2000

(30) Foreign Application Priority Data

Jan. 6, 1999 (JP) ............................................ 11-001288

(51) Int. Cl.[7] .............................................. H03K 19/00
(52) U.S. Cl. ............................. 326/93; 326/63; 326/80; 326/99; 327/156
(58) Field of Search ............................. 326/93, 63, 96, 326/99, 80; 327/159, 156; 375/376

(56) References Cited

U.S. PATENT DOCUMENTS

| | | | | |
|---|---|---|---|---|
| 4,808,937 A | * | 2/1989 | Correa et al. ................ | 327/159 |
| 5,404,250 A | * | 4/1995 | Hase et al. .................... | 360/51 |
| 5,420,544 A | * | 5/1995 | Ishibashi ...................... | 331/11 |
| 5,544,063 A | * | 8/1996 | Zanders et al. ............... | 702/65 |
| 5,633,766 A | * | 5/1997 | Hase et al. .................... | 360/51 |
| 5,636,254 A | * | 6/1997 | Hase et al. .................. | 375/371 |
| 5,748,018 A | * | 5/1998 | Ishikawa ..................... | 327/154 |
| 5,767,715 A | * | 6/1998 | Marquis et al. ............. | 327/159 |
| 5,878,097 A | * | 3/1999 | Hase et al. .................. | 375/371 |
| 6,037,813 A | * | 3/2000 | Eto et al. ..................... | 327/156 |

FOREIGN PATENT DOCUMENTS

| | | | | |
|---|---|---|---|---|
| JP | 5-11863 | 1/1993 | ............. | G05F/1/10 |
| JP | 8-32425 | 2/1996 | .......... | H03K/5/153 |

* cited by examiner

Primary Examiner—Michael Tokar
Assistant Examiner—Steven S. Paik
(74) Attorney, Agent, or Firm—Sughrue Mion, PLLC

(57) ABSTRACT

A data input/output circuit preferably used in a fast interface system such as Rambus™ interface or SyncLink™ interface for transmitting and/or receiving data in synchronization with a supplied clock. The data input/output circuit has a phase locked loop (PLL) circuit for differentially receiving the clock and a reference voltage to generate an internal clock having a predetermined phase delay with respect to the supplied clock, a register for storing setting data for changeably setting the level of the reference voltage, and a level shift circuit for setting the level of the reference voltage to be supplied to the PLL circuit to a predetermined value in accordance with the setting data stored in the register, and performs actual data transmission/reception processing in synchronization with the internal clock. The data input/output circuit optimally sets the level of the reference voltage to be supplied to the PLL circuit at the initial setting prior to data transmission/reception to optimize a margin in the internal clock.

12 Claims, 8 Drawing Sheets

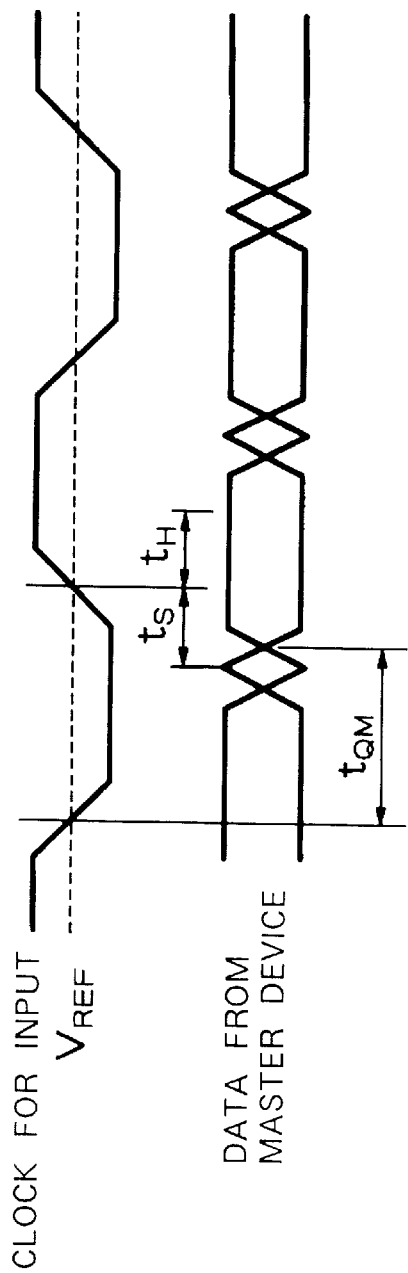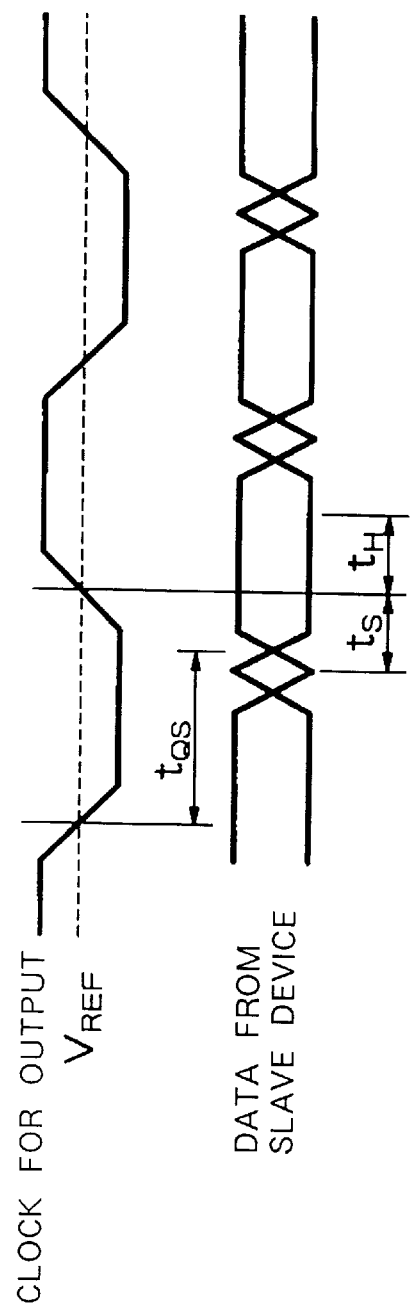

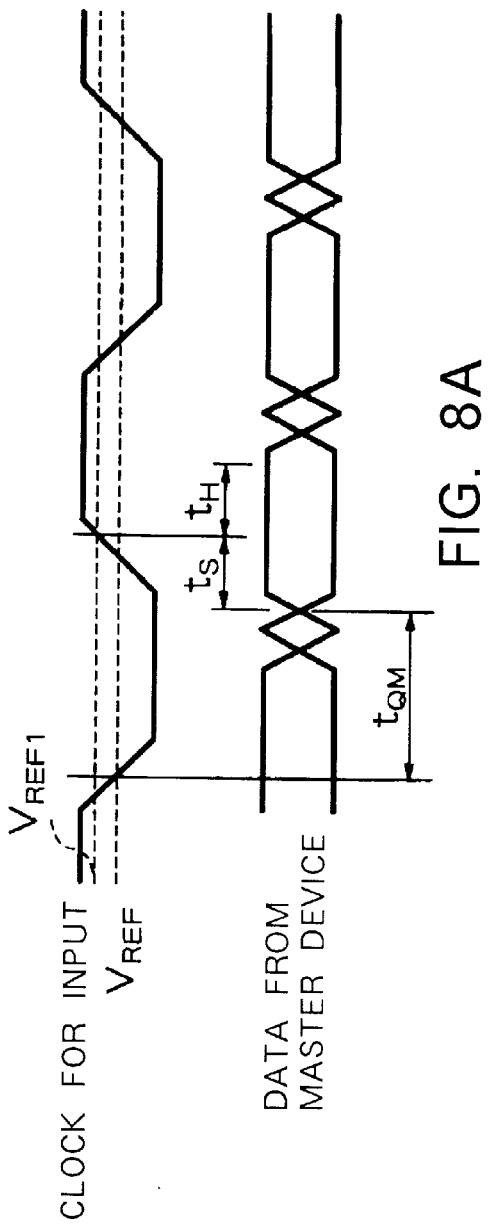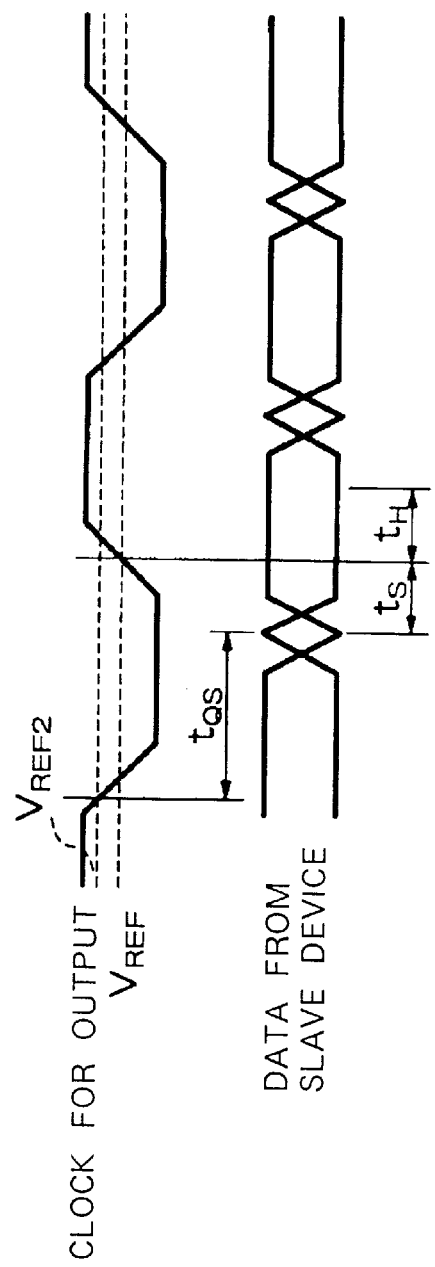

DATA INPUT/OUTPUT CIRCUIT AND INTERFACE SYSTEM USING THE SAME

BACKGROUND OF THE INVENTION

1. Field of the Invention

The present invention relates to an interface system for performing data transfer, and more particularly to a data input/output circuit which is preferably used for performing data transfer at high speed in an interface system and uses a reference voltage and a clock as differential inputs to operate in synchronization with the clock.

2. Description of the Prior Art

In recent years, with faster processing of CPU (Central Processing Unit), increasingly faster processing is achieved also in memory devices as typified by RDRAMs (Rambus™ DRAM (Dynamic Random Access Memory)), SLDRAM (SyncLink™ DRAM) or the like.

Schemes which independently use a clock for data input and a clock for data output have been proposed in Rambus™ interfaces or SyncLink™ interfaces for realizing fast data transfer between the CPU or its peripheral circuits and these memory devices.

FIG. 1 is a block diagram showing a configuration of a conventional interface system which independently uses a clock for data input and a clock for data output. As shown in FIG. 1, in such an interface-system, master device 1 manages data transfer between master device 1 and a plurality of slave devices (only two slave devices $2_1$, $2_2$ are shown in FIG. 1).

A clock for input and a clock for output are provided from clock generating circuit 4 to each of master device 1 and the plurality of slave devices $2_1$, $2_2$. Since data is typically transferred at a high rate of 500 MHz to 1 GHz on bus 5 connecting master device 1 with slave devices $2_1$, $2_2$, terminating device 3 is connected at the end of bus 5 for providing impedance matching of bus 5 and reducing distortion in waveform of the transferred signal.

Each of slave devices $2_1$, $2_2$ comprises a data input/output circuit for transmitting and receiving data in synchronization with the clock for input and the clock for output. The data input/output circuit receives data in synchronization with each of a rising edge and a falling edge of the clock for input, and transmits data in synchronization with each of a rising edge and a falling edge of the clock for output. Single reference voltage $V_{REF}$, which serves as a reference for determining a High level and a Low level in the clock for input and the clock for output, is provided to the data input/output circuit included in each of slave devices $2_1$, $2_2$. Reference voltage $V_{REF}$ is typically provided from master device 1, for example by dividing power supply voltage $V_{DD}$ using resistances.

FIG. 2 is a block diagram showing an example of a configuration of the above-mentioned data input/output circuit. As shown in FIG. 2, the data input/output circuit comprises PLL (phase locked loop) circuit for input clock 11 for using reference voltage $V_{REF}$ and the clock for input as differential inputs to generate therefrom an internal clock for input to be used within the device; PLL circuit for output clock 12 for using reference voltage $V_{REF}$ and the clock for output as differential inputs to generate therefrom an internal clock for output to be used within the device; first flip flop 13 and second flip flop 14 for synchronizing input data received through bus 5 and the internal clock for input; and selector circuit 15 for switching and outputting internal output data from within the device in synchronization with the internal clock for output.

PLL circuit for input clock 11 and PLL circuit for output clock 12 have the same circuit configuration, an example of which is shown in FIG. 3. When the circuit is simply called a PLL circuit, it refers hereinafter to both PLL circuit for input clock 11 and PLL circuit for output clock 12.

As shown in FIG. 3, the PLL circuit comprises first clock amplifier 31 for shaping clock waveform using the clock and the reference voltage $V_{REF}$ which are differentially supplied thereto; variable delay circuit 32 for adjustably delaying the phase of an output clock from first clock amplifier 31; clock driver 33 for increasing the driving ability of an output clock from variable delay circuit 32; and phase comparison circuit 36. Phase comparison circuit 36 comprises second clock amplifier 34 for shaping clock waveform using the clock and the reference voltage $V_{REF}$ which are differentially supplied thereto; and phase difference detecting circuit 35 for comparing the phase of an output clock from second clock amplifier 34 and the phase of an output clock from clock driver 33 to output a delay adjusting signal for changing the phase in variable delay circuit 32 in accordance with the comparison result. The output clock of clock driver is an internal clock for input (or an internal clock for output).

The PLL circuit is a circuit for providing a clock having the same phase as that of the clock for input (or the clock for output), to be accurate, a clock with one cycle delay, to the inside of the device. The use of such a PLL circuit enables cancellation of delay of the clock amplifier itself.

However, when the data input/output circuit receives data, it is necessary for reliable reception of data to establish a value of data at the time of a rising or falling edge of a clock and to hold the value of data for a predetermined time period to acquire the established data. Typically, a time period taken for establishing data is called setup time $t_s$, while a time period for holding necessary data is called hold time $t_H$.

In the conventional interface system for performing fast data transfer as described above, requirement becomes greater for the timing in passing data with respect to a clock. For example, when a slave device receives data, as shown in FIG. 4A, if data is outputted from a master device at a time delayed by $t_{QM}$ with respect to the clock for input, a problem occurs that the slave device can not receive the data since the timing of data reception with respect to the clock for input is not sufficient for setup time $t_S$ required for receiving data. When a slave device transmits data, as show in FIG. 4B, if the slave device transmits the data at a time delayed by $t_{QS}$ with respect to the clock for output, a problem occurs that the master device can not receive the data since the timing of data reception with respect to the clock for output is not sufficient for setup time $t_S$ required for receiving data.

SUMMARY OF THE INVENTION

It is a first object of the present invention to provide a data input/output circuit which solves the problems as described above inherent in the prior art and which can set reception timing of input data to an optimum value.

It is a second object of the present invention to provide an interface system having such a data input/output circuit.

The first object of the present invention is achieved by a data input/output circuit for transmitting and/or receiving data in synchronization with a supplied clock, comprising: a circuit for differentially receiving the clock and a reference voltage; a register for storing setting data for changeably setting a level of the reference voltage; and a level shift circuit for setting the level of the reference voltage to be supplied to the circuit to a predetermined value in accordance with the setting data stored in the register.

In the present invention, the circuit is typically a phase locked loop (PLL) circuit for generating an internal clock having a predetermined phase delay with respect to the supplied clock.

The second object of the present invention is achieved by an interface system comprising: a master device for managing data transfer; a plurality of slave devices, each of which having the aforementioned data input/output circuit for performing data transfer with the master device in accordance with instructions from the master device; and an interface line for transmitting the setting data from the master device to the slave devices.

In the data input/output circuit arranged as described above, since the clock and the reference voltage are differentially supplied, the phase of the outputted internal clock is optimally adjusted by changing the setting data stored in the register to change the value of the reference voltage. Therefore, it is possible to ensure a required setup time at reception timing of data. For this reason, even when data is transmitted with delay to the clock, the data can be reliably received. Additionally, according to the present invention, data can be reliably received in an interface system for performing data transfer using a clock for input and a clock for output independently of the clock for input.

The above and other objects, features, and advantages of the present invention will become apparent from the following description referring to the accompanying drawings which illustrate examples of preferred embodiments of the present invention.

BRIEF DESCRIPTION OF THE DRAWINGS

FIGS. 4A and 4B are timing charts showing operational waveform upon data input and data output, respectively, in respective portions of the data input/output circuit shown in FIG. 1;

FIGS. 8A and 8B are timing charts showing operational waveform upon data input and data output, respectively, in respective portions of the data input/output circuit shown in FIG. 5.

DESCRIPTION OF THE PREFERRED EMBODIMENT OF THE INVENTION

Figure 5:
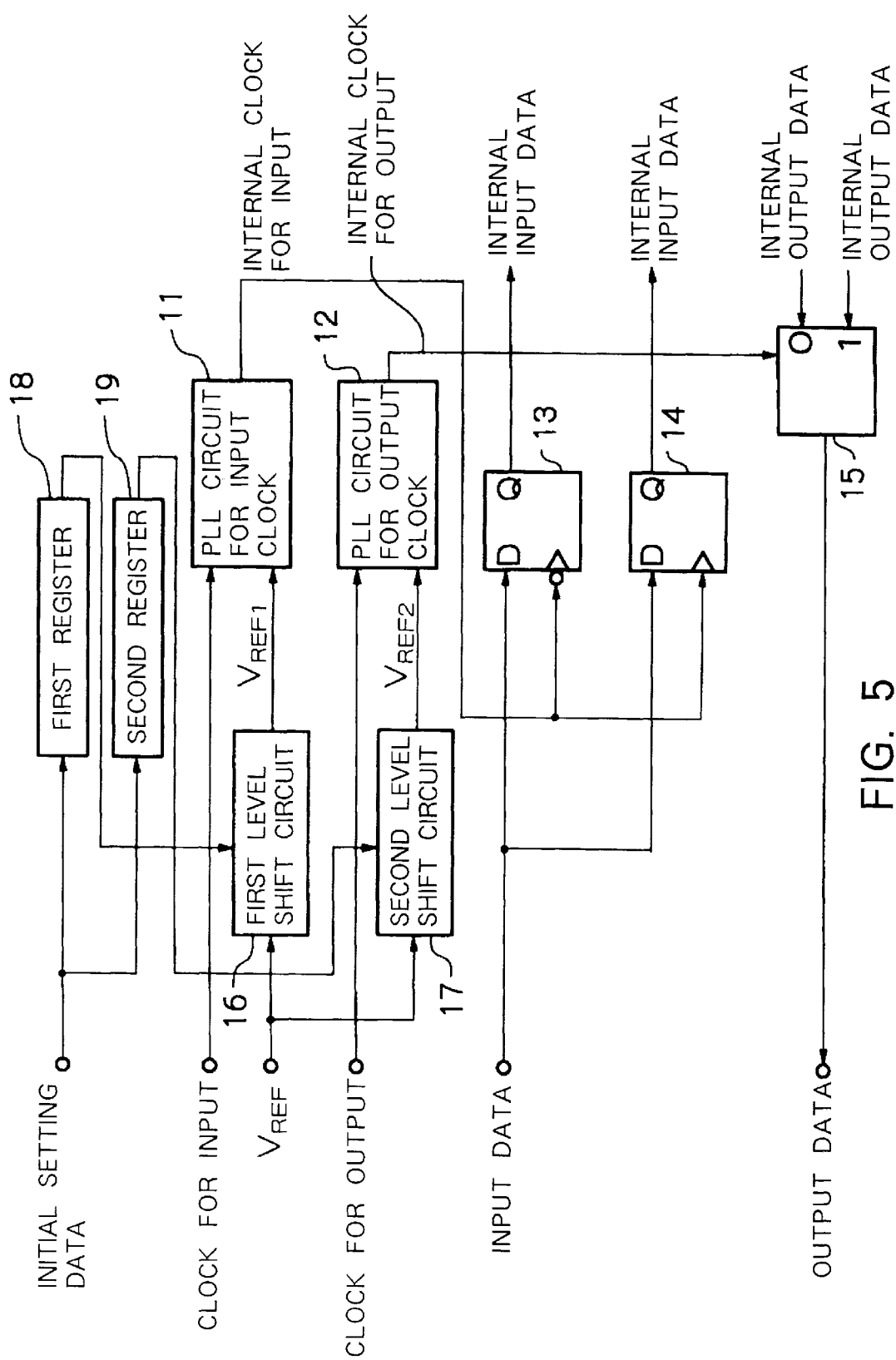
FIG. 5 is a block diagram showing a configuration of a data input/output circuit in a preferred embodiment of the present invention.

A data input/output circuit in a preferred embodiment of the present invention is provided in each slave device. As shown in FIG. 5, the data input/output circuit in the present embodiment has a configuration which differs from that of the conventional data input/output circuit shown in FIG. 2 in that the former is additionally provided with first level shift circuit 16 for changeably setting the level of reference voltage $V_{REF}$ to be supplied to PLL circuit for input clock 11, second level shift circuit 17 for changeably setting the level of reference voltage $V_{REF}$ to be supplied to PLL circuit for output clock 12, first register 18 for storing initial setting data for changing the level of reference voltage $V_{REF}$ in PLL circuit for input clock 11, and second register 19 for storing initial setting data for changing the level of reference voltage $V_{REF}$ in PLL circuit for output clock 12. Each of level shift circuits 16, 17 is supplied with reference voltage $V_{REF}$ from a bus. Initial setting data into respective registers 18, 19 are transmitted from a master device through an interface line for setting data, as later described.

Figure 2:
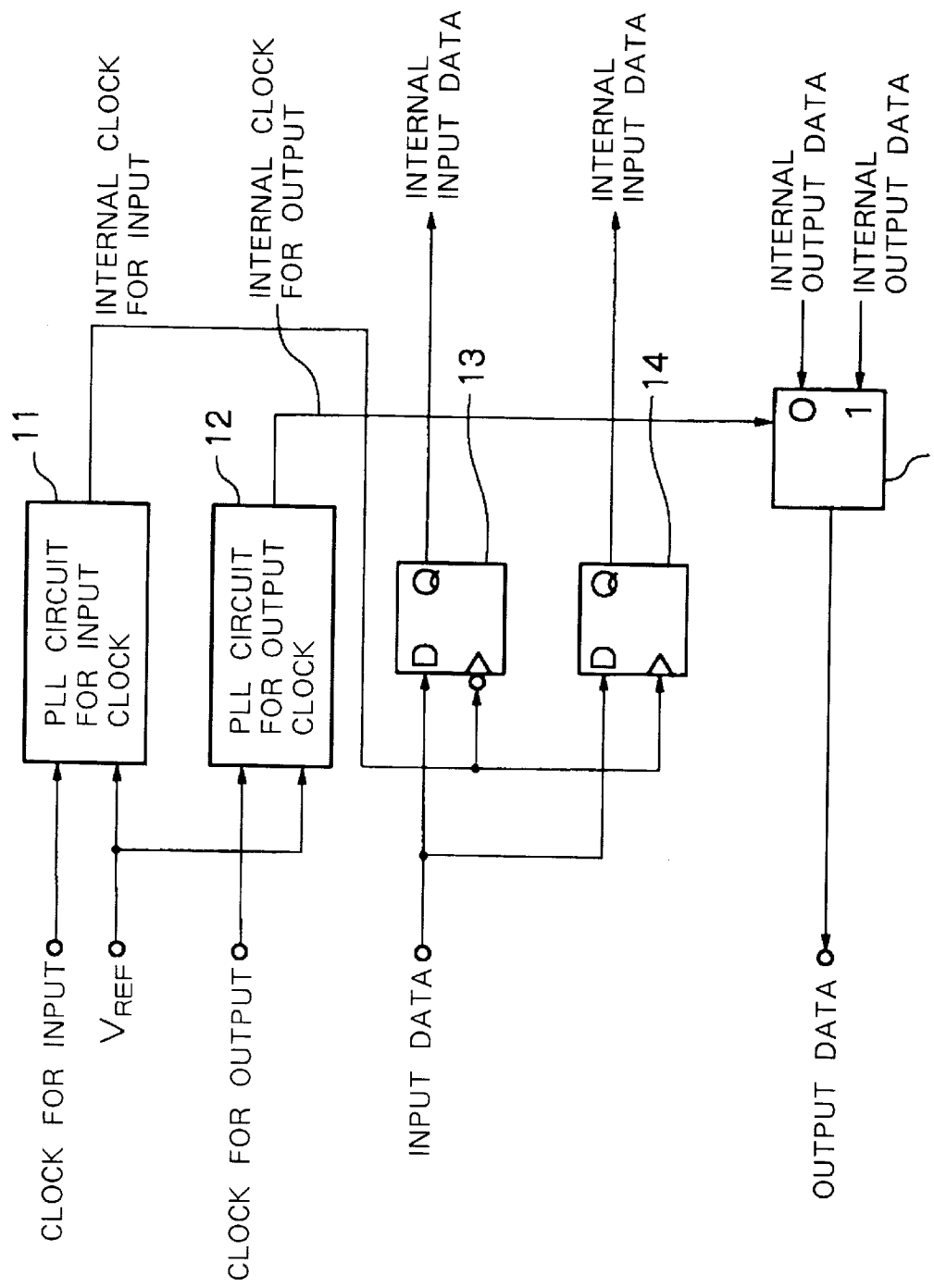
FIG. 2 is a block diagram showing a configuration of a conventional data input/output circuit provided in the conventional interface system shown in FIG. 1.
Figure 3:
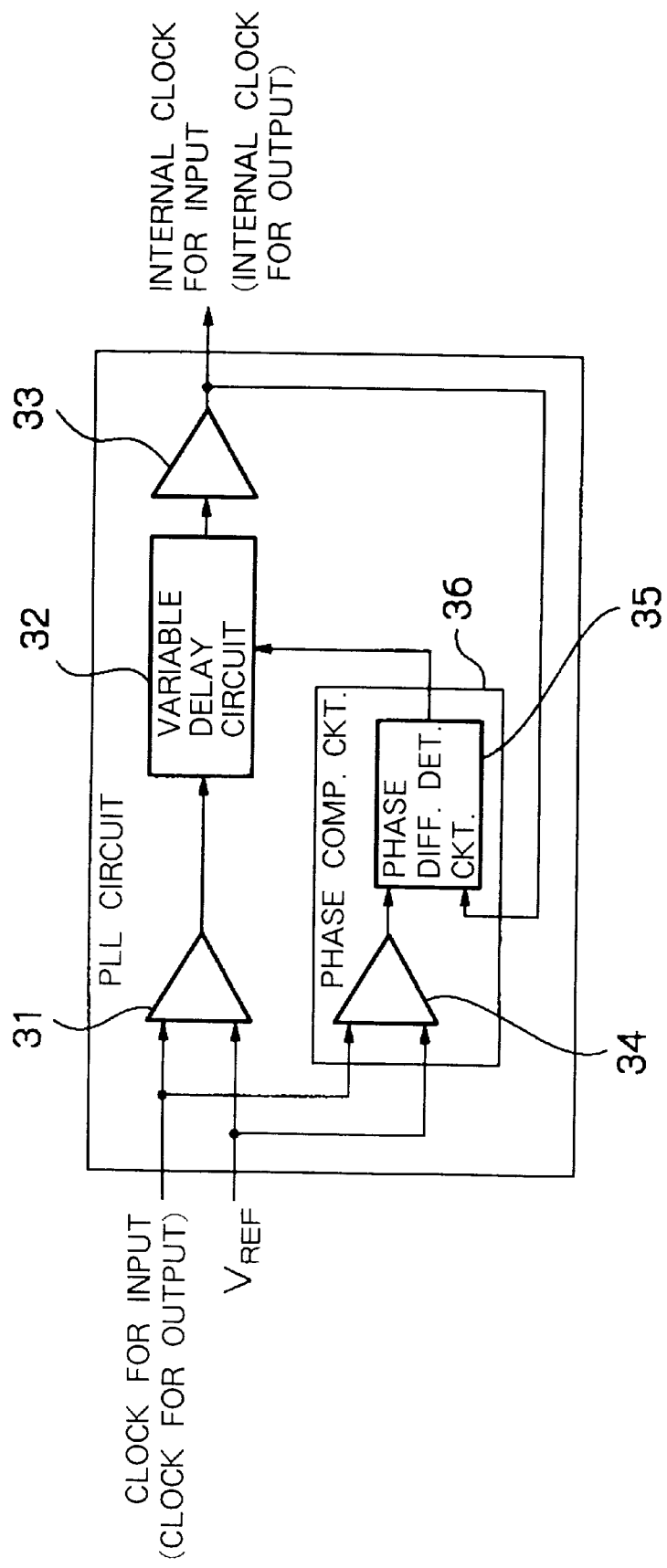
FIG. 3 is a block diagram showing an example of a PLL (phase locked loop) circuit for input clock and a PLL circuit for output clock provided in the data input/output circuit shown in FIG. 2.

PLL circuit for input clock 11 is supplied with reference voltage $V_{REF1}$ from first level shift circuit 16 instead of reference voltage $V_{REF}$, while PLL circuit for output clock 12 is supplied with reference voltage $V_{REF2}$ from second level shift circuit 17 instead of reference voltage $V_{REF}$. For configurations other than those described above, the data input/output circuit shown in FIG. 5 is similar to the conventional input/output circuit shown in FIG. 2. In FIG. 5, components identical to those in FIG. 2 are designated the same reference numerals as those in FIG. 2.

Figure 6:
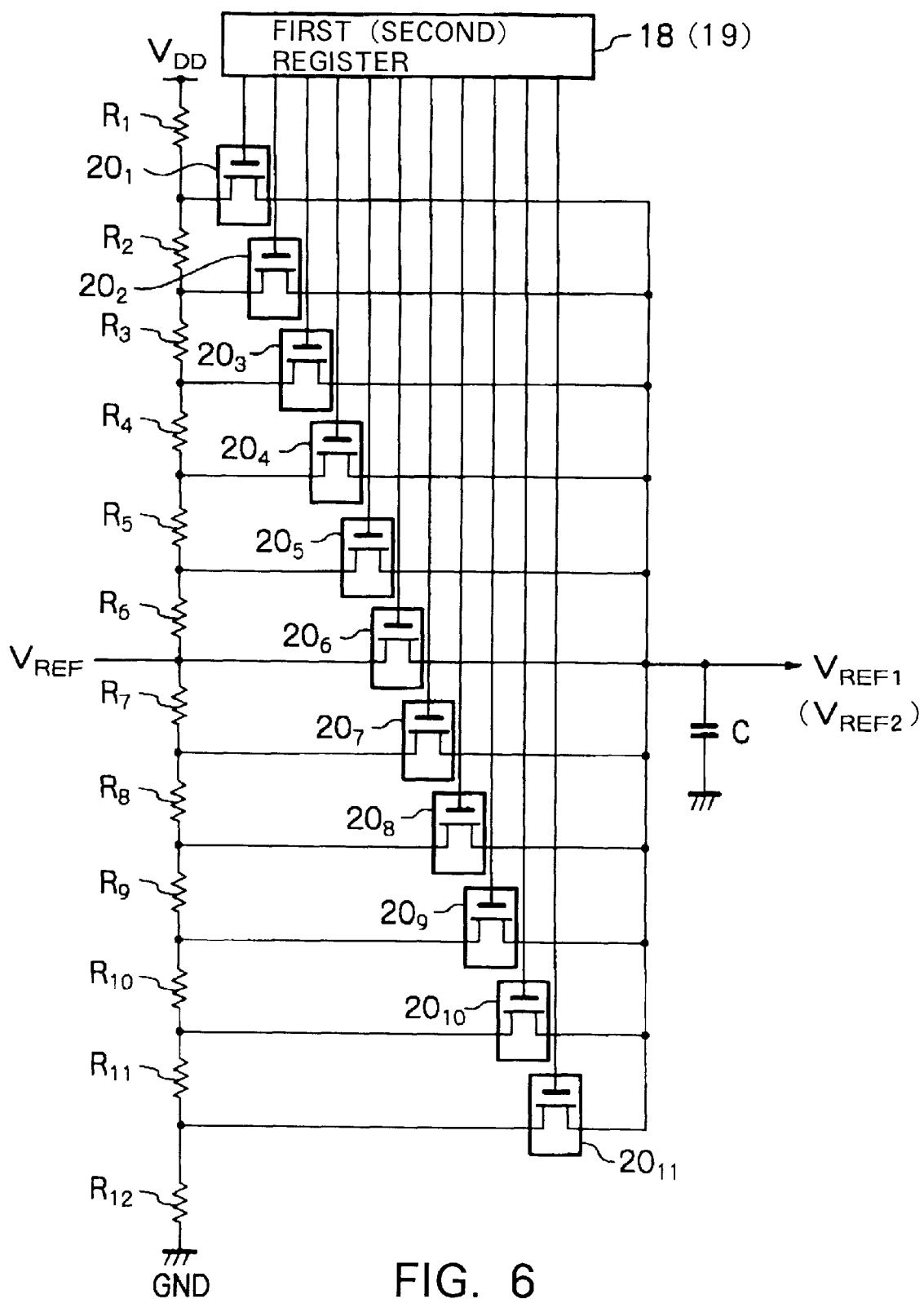
FIG. 6 is a circuit diagram showing an example of a configuration of each of level shift circuits in the data input/output circuit shown in FIG. 5.

First level shift circuit 16 and second level shift circuit 17 have the same circuit configuration. FIG. 6 is a circuit diagram showing an example of a configuration of these level shift circuits.

The level shift circuit has, for example, a plurality of resistors inserted in series between power supply voltage $V_{DD}$ and ground potential GND, a plurality of switch circuits having their one ends connected to respective connecting points of the resistors and their other ends connected together, and capacitor C inserted between the common ends of the switch circuits and the ground potential for removing noise. In the example shown in FIG. 6, the level shift circuit has twelve resistors $R_1$ to $R_{12}$ connected in series, and eleven switch circuits $20_1$ to $20_{11}$. The level shift circuit is configured to output reference voltage $V_{REF1}$ ($V_{REF2}$) from the common ends of the switch circuits to the PLL circuit. Each of the switch circuits turns on/off in accordance with values of respective bits in data outputted in parallel from first register 18 (second register 19). Each switch circuit is formed from FET (Field Effect Transistor), for example.

Figure 1:
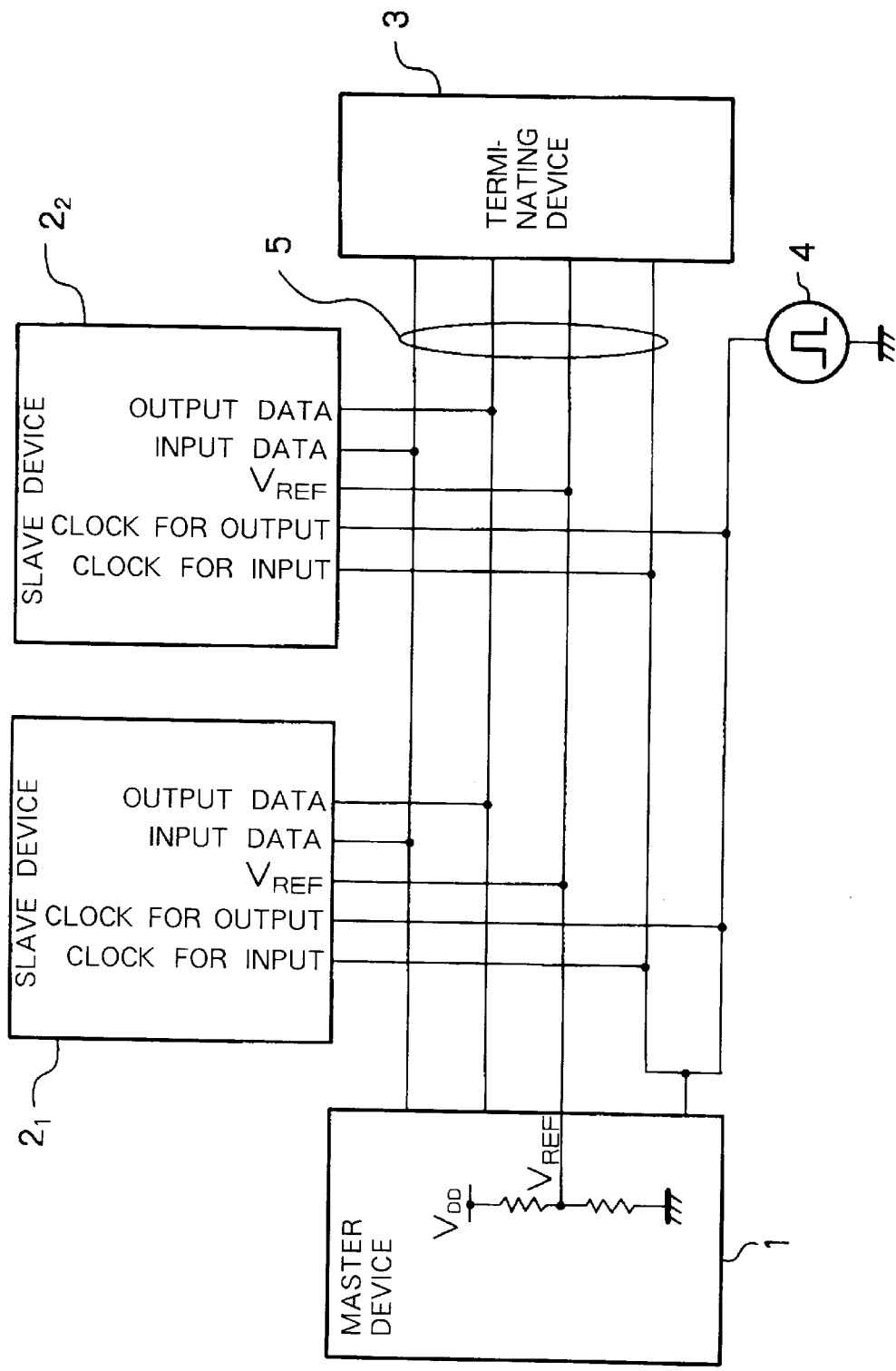
FIG. 1 is a block diagram showing a configuration of a conventional interface system using a clock for data input and a clock for data output.
Figure 7:
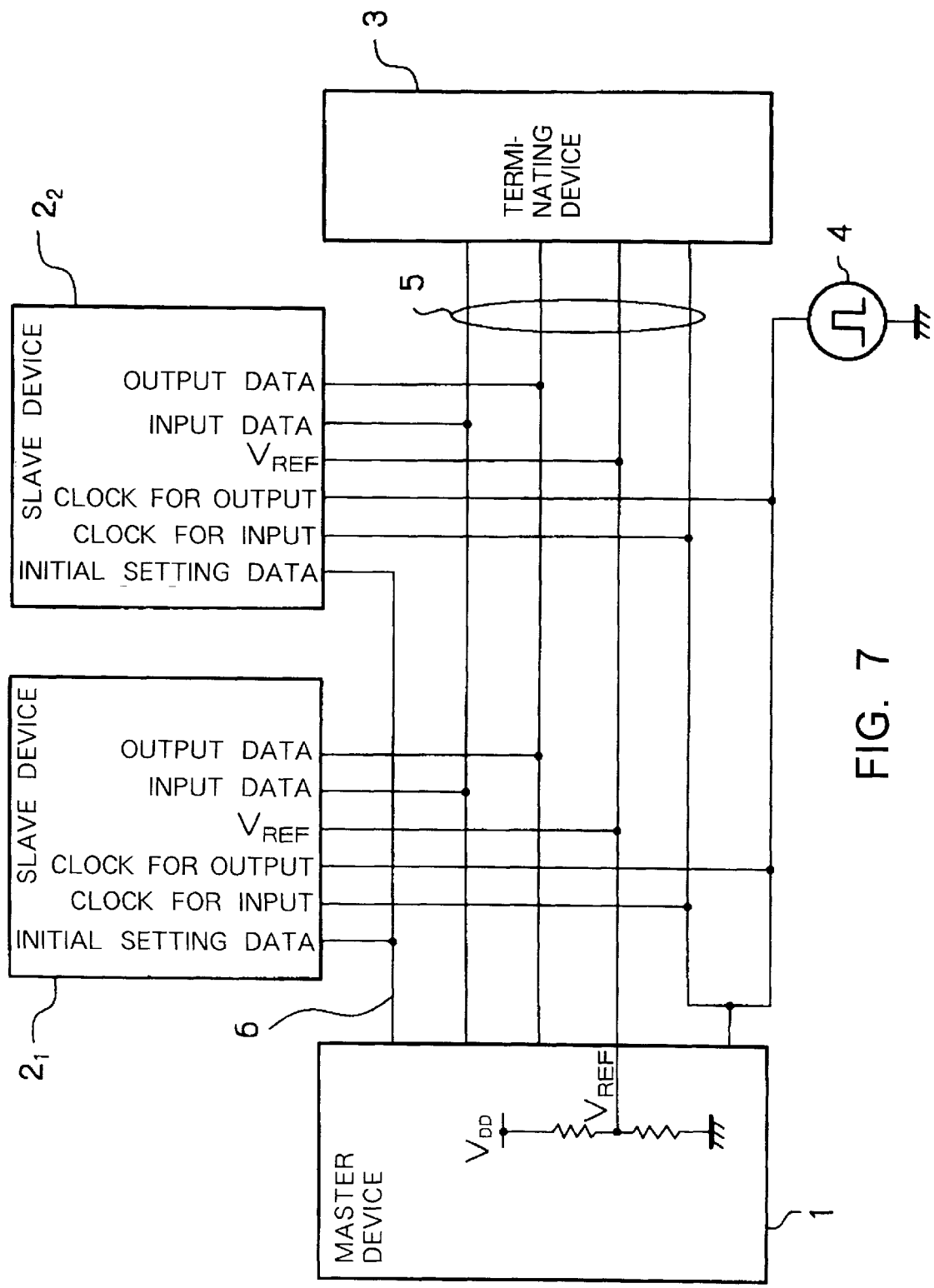
FIG. 7 is a block diagram showing an example of a configuration of an interface system having the data input/output circuit shown in FIG. 5.

FIG. 7 shows a configuration of an interface system having the aforementioned data input/output circuit according to the present embodiment. The interface system has a configuration which differs from that of the conventional interface system shown in FIG. 1 in that the former is additionally provided with interface line for setting data 6 for transmitting initial setting data to first register 18 and second register 19. In FIG. 7, components identical to those in FIG. 1 are designated by the same reference numerals as those in FIG. 1.

Interface line for setting data 6 is a low-speed serial interface line for clock and data signals of approximately several MHz. The initial setting data is transmitted from master device 1 to respective slave devices $2_1$, $2_2$.

Next, description will be made for the operation of the aforementioned input/output circuit and the interface system.

In first level shift circuit 16 and second level shift circuit 17, one of switch circuits $20_1$ to $20_{11}$ is turned on based on the initial setting data recorded in first register 18 and second register 19, respectively. As a result, predetermined internal reference voltages $V_{REF1}$ and $V_{REF2}$ are outputted from first level shift circuit 16 and second level shift circuit 17, respectively.

Since the PLL circuit differentially amplifies an input clock and the internal reference voltage with first clock amplifier 31, a change in the value of internal reference voltage $V_{REF1}$ ($V_{EF2}$) enables a change in the phase of an internal clock for input (internal clock for output) which is an output from the PLL circuit.

A case where master device 1 transfers data to one of slave devices $2_1$, $2_2$ will be considered. Master device 1 outputs predetermined initial setting data to the slave device at the initial setting. The Slave device receives data on the basis of the initial setting data stored in first register 18. At this point, master device 1 adjusts the value of the initial setting data such that the slave device can receive the data. Specifically, master device 1 adjusts the value of internal reference voltage $V_{REF1}$ by changing the initial setting data such that required setup time $t_S$ is ensured at the timing of data reception.

As shown in FIG. 8A, in the slave device, the value of reference voltage $V_{REF}$ is changed to internal reference voltage $V_{REF1}$ with first level shift circuit 16 to delay the timing of input data reception at the slave device. As a result, if data is outputted from master device 1 at a time delayed by $t_{QM}$ with respect to the clock for input, the slave device can receive the data at the timing sufficient for setup time $t_S$. Although the timing of input data reception is delayed, the slave device can receive the data from master device 1 without fail since hold time $t_H$ is ensured as shown in FIG. 8A.

Next, a case where master device 1 causes one of slave devices $2_1$, $2_2$ to output data will be considered. The slave device transmits data on the basis of the initial setting data recorded in second register 19. At this point, master device 1 adjusts the values of the initial setting data such that it can receive the data. Specifically, master device 1 adjusts the value of internal reference voltage $V_{REF2}$ by changing the initial setting data such that required setup time $t_S$ is ensured at the timing of data reception.

As shown in FIG. 8B, in the slave device, the value of reference voltage $V_{REF}$ is changed to internal reference voltage $V_{REF2}$ with second level shift circuit 17 to advance the timing of output data reception at the slave device. As a result, if data is outputted from the slave device at a time delayed by $t_{QS}$ with respect to the clock for output, master device 1 can receive the data at the timing sufficient for setup time $t_S$.

As described above, since the value of reference voltage $V_{REF}$ input to each PLL circuit can be changed by master device 1, it is possible to adjust the timing of transmission and reception of data at the slave device with this method. However, when master device 1 transfers data to and/or from a plurality of the slave devices, master device 1 must adjust the value of reference voltage $V_{REF}$ each time it switches the slave device to which data is transferred since optimum values for the reference voltage vary among respective slave devices, resulting in complicated processing.

To avoid this, respective optimum initial setting data may be transmitted to respective slave devices $2_1$, $2_2$ at the initial setting as in the present embodiment to eliminate the need for such processing thereafter, thereby making it possible to prevent complicated processing.

While the aforementioned description shows a configuration in which a clock for input (a clock for output) and a reference voltage (internal reference voltage) are supplied to PLL circuits, the PLL circuits are not necessarily required, and similar effects to those described above can be obtained with a configuration in which a clock and a reference voltage are differentially input to a circuit comprising only a clock amplifier, for example.

Additionally, while the aforementioned description uses as an example an interface system which independently uses a clock for data input and a clock for data output, even an interface system which uses a clock in common for data input and data output can achieve similar effects to those described above by providing a register for recording initial setting data for changeably setting a level of reference voltage $V_{REF}$ and a level shift circuit for setting the level of reference voltage $V_{REF}$ to a redetermined value in accordance with the initial setting data recorded in the register. In other words, the data input/output circuit according to the present invention is preferable for use in an interface system for performing fast data transfer in synchronization with a differentially input clock as well as a reference voltage.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A data input/output circuit for transmitting and/or receiving data in synchronization with a supplied clock, comprising:

a phase locked loop circuit for differentially receiving the clock and a reference voltage and for generating an internal clock having a predetermined phase delay with respect to the clock;

a register for storing setting data for changeably setting a level of the reference voltage; and a level shift circuit for setting the level of the reference voltage to be supplied to said phase locked loop circuit to a predetermined level in accordance with the setting data stored in said register.

2. The data input/output circuit according to claim 1, wherein the phase delay is changed in accordance with the reference voltage supplied to said phase locked loop circuit.

3. The data input/output circuit according to claim 1, wherein t he data is transmitted and/or received in synchronization with the internal clock.

4. The data input/output circuit according to claim 1, wherein said phase locked loop circuit comprises:

a first clock amplifier for shaping waveform of the clock using the reference voltage and the clock as differential inputs;

a variable delay circuit for adjustably delaying a phase of an output clock from said first clock amplifier;

a clock driver for amplifying an output from said variable delay circuit to output as the internal clock;

a second clock amplifier for shaping waveform of the clock using the reference voltage and the clock as differential inputs; and a phase difference detecting circuit for comparing phases of an output from said second clock amplifier and of the internal clock to output a delay adjusting signal for changing a phase in said variable delay circuit in accordance with the phase comparison result.

5. The data input/output circuit according to claim 4, wherein the data is transmitted and/or received in synchronization with the internal clock.

6. A data input/output circuit for receiving data in synchronization with a supplied clock for input and for transmitting data in synchronization with a clock for output supplied independently of the clock for input, comprising:

a first circuit for differentially receiving the clock for input and a first reference voltage;

a second circuit for differentially receiving the clock for output and a second reference voltage;

a first register for storing first setting data for changeably setting a level of the first reference voltage;

a second register for storing second setting data for changeably setting a level of the second reference voltage;

a first level shift circuit for setting the level of the first reference voltage to a predetermined value in accordance with the first setting data stored in said first register; and a second level shift circuit for setting the level of the second reference voltage to a predetermined value in accordance with the second setting data stored in said second register.

7. The data input/output circuit according to claim 6, wherein said first circuit is a first phase locked loop circuit for generating a first internal clock having a predetermined phase delay with respect to the clock for input, and said second circuit is a second phase locked loop circuit for generating a second internal clock for having a predetermined phase delay with respect to the clock for output.

8. The data input/output circuit according to claim 7, further comprising a flip flop for receiving the data in synchronization with the first internal clock and a selector for transmitting the data in synchronization with the second internal clock.

9. An interface system comprising:

a master device for managing data transfer;

a plurality of slave devices, each of said slave devices having a data input/output circuit for transmitting and/or receiving data in synchronization with a supplied clock, the data input/output circuit including a circuit for differentially receiving the clock and a reference voltage, a register for storing setting data for changeably setting a level of the reference voltage, and a level shift circuit for setting the level of the reference voltage to be supplied to said circuit to a predetermined value in accordance with the setting data stored in said register, each of said slave devices having said data input/output circuit for performing data transfer to and/or from said master device in accordance with instructions from said master device; and an interface line for transmitting the setting data from said master device to said slave devices.

10. The interface system according to claim 9, wherein said circuit for differentially receiving is a phase locked loop circuit for generating an internal clock having a predetermined phase delay with respect to the clock.

11. An interface system comprising:

a master device for managing data transfer;

a plurality of slave devices, each of said slave devices having a data input/output circuit for receiving data in synchronization with a supplied clock for input and for transmitting data in synchronization with a clock for output supplied independently of the clock for input, the data input/output circuit including a first circuit for differentially receiving the clock for input and a first reference voltage, a second circuit for differentially receiving the clock for output and a second reference voltage, a first register for storing first setting data for changeably setting a level of the first reference voltage, a second register for storing second setting data for changeably setting a level of the second reference voltage, a first level shift circuit for setting the level of the first reference voltage to a predetermined value in accordance with the first setting data stored in said first register, and a second level shift circuit for setting the level of the second reference voltage to a predetermined value in accordance with the second setting data stored in said second register, each of said slave devices having said data input/output circuit for performing data transfer with said master device in accordance with instructions from said master device; and an interface line for transmitting the first setting data and the second setting data from said master device to said slave devices.

12. The interface system according to claim 11, wherein said first circuit is a first phase locked loop circuit for generating a first internal clock having a predetermined phase delay with respect to the clock for input, and said second circuit is a second phase locked loop circuit for generating a second internal clock for having a predetermined phase delay with respect to the clock for output.

* * * * *